United States Patent
Forster et al.

(10) Patent No.: US 6,673,724 B2
(45) Date of Patent: *Jan. 6, 2004

(54) PULSED-MODE RF BIAS FOR SIDE-WALL COVERAGE IMPROVEMENT

(75) Inventors: John Forster, San Francisco, CA (US); Praburam Gopalraja, Sunnyvale, CA (US); Bradley O. Stimson, San Jose, CA (US); Liubo Hong, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 102 days.

This patent is subject to a terminal disclaimer.

(21) Appl. No.: 10/037,018

(22) Filed: Nov. 7, 2001

(65) Prior Publication Data

US 2002/0068464 A1 Jun. 6, 2002

Related U.S. Application Data

(63) Continuation of application No. 09/454,355, filed on Dec. 3, 1999, now Pat. No. 6,344,419.

(51) Int. Cl.[7] ............................................. H01L 21/31
(52) U.S. Cl. ..................................................... 438/758
(58) Field of Search ............................ 427/457, 523, 427/526, 458, 472, 569, 570, 571, 585, 598; 438/466, 469, 584, 710, 778, 788

(56) References Cited

U.S. PATENT DOCUMENTS

| | | | |
|---|---|---|---|
| 3,410,774 A | 11/1968 | Barson et al. | 204/192 |
| 4,756,801 A | 7/1988 | Jokinen et al. | 162/175 |
| 4,865,712 A | 9/1989 | Mintz | 204/298 |
| 4,874,493 A | 10/1989 | Pan | 204/192.11 |
| 4,874,494 A | 10/1989 | Ohmi | 204/192.12 |
| 4,963,239 A | 10/1990 | Shimamura et al. | 204/192.12 |
| 4,999,096 A | 3/1991 | Nihei et al. | 204/192.3 |
| 5,078,847 A | 1/1992 | Grosman et al. | 204/192.31 |
| 5,126,028 A | 6/1992 | Hurwitt et al. | 204/192.13 |
| 5,262,354 A | 11/1993 | Cote et al. | 437/195 |
| 5,302,266 A | 4/1994 | Grabarz et al. | 204/192.12 |
| 5,303,139 A | 4/1994 | Mark | 363/63 |
| 5,346,600 A | 9/1994 | Nieh et al. | 204/192.3 |
| 5,376,584 A | 12/1994 | Agarwala | 437/183 |
| 5,486,492 A | 1/1996 | Yamamoto et al. | 437/192 |
| 5,510,011 A | 4/1996 | Okamura et al. | 204/192.3 |
| 5,584,974 A | 12/1996 | Sellers | 204/192.13 |
| 5,585,673 A | 12/1996 | Joshi et al. | 257/751 |
| 5,585,974 A | 12/1996 | Shrinkle | 360/46 |
| 5,605,615 A | 2/1997 | Goolsby et al. | 205/83 |
| 5,612,254 A | 3/1997 | Mu et al. | 437/195 |
| 5,639,357 A | 6/1997 | Xu | 204/192.3 |

(List continued on next page.)

FOREIGN PATENT DOCUMENTS

| | | | | |
|---|---|---|---|---|
| EP | 0 123 456 A2 | 10/1984 | | H04N/7/12 |
| EP | 0 297 502 A2 | 6/1988 | | C23C/14/34 |
| EP | 0 798 778 A2 | 10/1997 | | H01L/21/768 |
| EP | 0 892 428 A2 | 1/1999 | | H01L/21/768 |
| EP | 0 788 160 A3 | 6/1999 | | H01L/23/522 |

OTHER PUBLICATIONS

US 5,863,392, 1/1999, Drummond et al. (withdrawn)
U.S. patent application Ser. No. 09/360,883, Paterson et al., filed Jul. 23, 1999.

(List continued on next page.)

*Primary Examiner*—Evan Pert
(74) *Attorney, Agent, or Firm*—Moser, Patterson & Sheridan

(57) ABSTRACT

The present invention provides a method and apparatus for achieving conformal step coverage of one or more materials on a substrate using sputtered ionized material. A target provides a source of material to be sputtered by a plasma and then ionized by an inductive coil, thereby producing electrons and ions. In one embodiment, one or both of the signals to the substrate and the target are modulated. Preferably, the modulated signal to the substrate includes a negative voltage portion and a zero voltage portion.

21 Claims, 7 Drawing Sheets

U.S. PATENT DOCUMENTS

| | | | |
|---|---|---|---|
| 5,651,865 A | 7/1997 | Sellers | 204/192.13 |
| 5,693,563 A | 12/1997 | Teong | 437/190 |
| 5,718,813 A | 2/1998 | Drummond et al. | 204/192.12 |
| 5,725,739 A | 3/1998 | Hu | 204/192.3 |
| 5,731,245 A | 3/1998 | Joshi et al. | 438/705 |
| 5,744,376 A | 4/1998 | Chan et al. | 437/190 |
| 5,759,906 A | 6/1998 | Lou | 438/623 |
| 5,770,023 A | 6/1998 | Sellers | 204/192.3 |
| 5,780,357 A | 7/1998 | Xu et al. | 438/639 |
| 5,807,467 A | 9/1998 | Givens et al. | 204/192.12 |
| 5,810,963 A | 9/1998 | Tomioka | 156/345 |
| 5,810,982 A | 9/1998 | Sellers | 204/298.08 |
| 5,858,184 A | 1/1999 | Fu et al. | 204/192.17 |
| 5,904,565 A | 5/1999 | Nguyen et al. | 438/687 |
| 5,933,753 A | 8/1999 | Simon et al. | 438/629 |
| 5,966,634 A | 10/1999 | Imohara et al. | 438/687 |
| 5,968,327 A | 10/1999 | Kobayashi et al. | 204/298.11 |
| 5,972,192 A | 10/1999 | Dubin et al. | 205/101 |
| 5,976,327 A | 11/1999 | Tanaka | 204/192.15 |
| 6,001,420 A | 12/1999 | Mosely et al. | 427/258 |
| 6,051,114 A | 4/2000 | Yao et al. | 204/192.3 |
| 6,071,398 A | 6/2000 | Martin et al. | 205/103 |
| 6,074,544 A | 6/2000 | Reid et al. | 205/157 |
| 6,132,584 A | 10/2000 | Hubel | 205/103 |
| 6,344,419 B1 * | 2/2002 | Forster et al. | 438/758 |

OTHER PUBLICATIONS

U.S. patent application Ser. No. 08/768,058, Ramaswami et al., filed Dec. 16, 1996.

U.S. patent application Ser. No. 09/449,202, Gopalraja, filed Nov. 24, 1999.

U.S. patent application Ser. No. 09/454,355, Forster, filed Dec. 3, 1999.

U.S. patent application Ser. No. 09/219,187, Sivaramakrishnan et al., filed Dec. 21, 1998.

"Endpoint Detection method for Ion Etching of a Material Having a Titanium Nitride Underlayer", Research Disclosure, Feb. 1991, No. 322, Kenneth Mason Publications Ltd. England.

Novellus Damascus Home Page, "12 Steps of Damascus".

S. Matsuo, Reactive ion–beam etching and plasma deposition techniques using electron cyclotron resonance plasma, *Appl. Sol. State Sci*, Academic Press (1985), pp. 75–117.

Gorbatkin, et al., Cu metallization using a permanent magnet electron cyclotron resonance microwave plasma sputtering hybrid system, *J. Vac. Sci. Tech*, 14(3) (May/Jun. 1996), pp. 1853–1859.

Park, et al., A novel A–1 reflow process using surface modification by the ECR plasma treatment and its application to the 256Mbit DRAM, *IEDM 94*, 109–112, pp. 5.4.1–5.5.5 (1994).

Koenig, et al., RF sputtering system with a variable substrate bias, *IBM Tech, Discl. Bull* 13(2) (Jul. 1970), pp. 323–324.

L. J. Kochel, "Pressure control of rf bias for sputtering", Rev. Sci. Instrm., vol. 47, No. 12 (Dec. 1976), pp. 1555–1557.

Suzuki, et al., "Microwave plasma etching", Pergamon Press Ltd., vol. 34, No. 10/11 (1984) pp. 953–957.

Rossnagel, et al., Collimated magnetron sputter deposition with grazing angle ion bombardment, J. Vac. Sci Tech, vol. 13, No. 1 (Jan./Feb. 1995), pp. 156–158.

Yasui, et al., "Electron cyclotron resonance plasma generation using a planar ring–cusp magnetic field and reentrant coaxial cavity", J. Vac. Sci. Tech., vol. 13, No. 4 (Jul./Aug. 1995), pp. 2105–2109.

Holber, et al., "Copper deposition by electron cyclotron resonance plasma", J. Vac. Sci. Tech., vol. 11, No. 6 (Nov./Dec. 1993), pp. 2903–2910.

Cheng, et al., "Directional deposition of Cu into semiconductor trench structures using ionized magnetron sputtering", J. Vac. Sci. Tech., vol. 13, No. 2 (Mar./Apr. 1995), pp. 203–208.

P. Kidd, "A Magnetically confined and electron cyclotron resonance heated plasma machine for coating and ion surface modification use", J. Vac. Sci. Tech., vol. 9, No. 3(May/Jun. 1991), pp. 466–473.

M. Yamashita, "Fundamental characteristics of built–in high–frequency coil–type sputtering apparatus", *J. Vac. Sci. Tech.*, 7(2)(Mar./Apr. 1989), pp. 151–158.

S. Samukawa, "Wave propagation and plasma uniformity in an electron cyclotron resonance plasma", *J. Vac. Sci. Tech.*, 11(5) (Sep./Oct. 1993), pp. 2572–2576.

Apblett, et al., "Silicon nitride growth in a high–density plasma system", *Solid State Tech*, (Nov. 1995), pp. 73–74 & 78 and 80.

Suzuki, et al., "Microwave Plasma Etching". J. *App. Phys*, 16(11) (Nov. 1977), pp. 1979–1984.

Getty, et al., Size–scalable 2.45 GHz electron cyclotron resonance plasma source using permanent magnets and waveguide coupling, J. Vac. Sci. Tech., 12(1) (Jan./Feb. 1994), pp. 408–415.

Hamaguchi, et al., Simulations of trench–lling pro les under ionzed magnetron sputter metal deposition;, *J. Vac. Sci. Tech*, 13(2) (Mar./Apr. 1995), pp. 183–191.

* cited by examiner

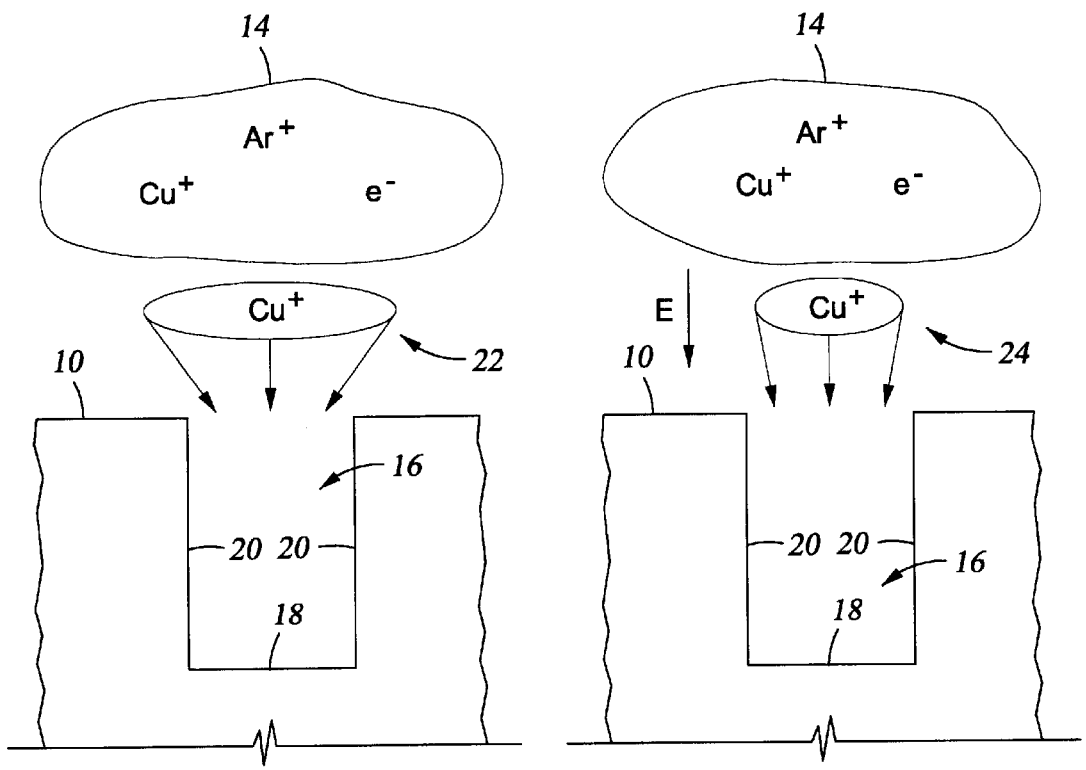
Fig. 1 (PRIOR ART)
Fig. 2 (PRIOR ART)
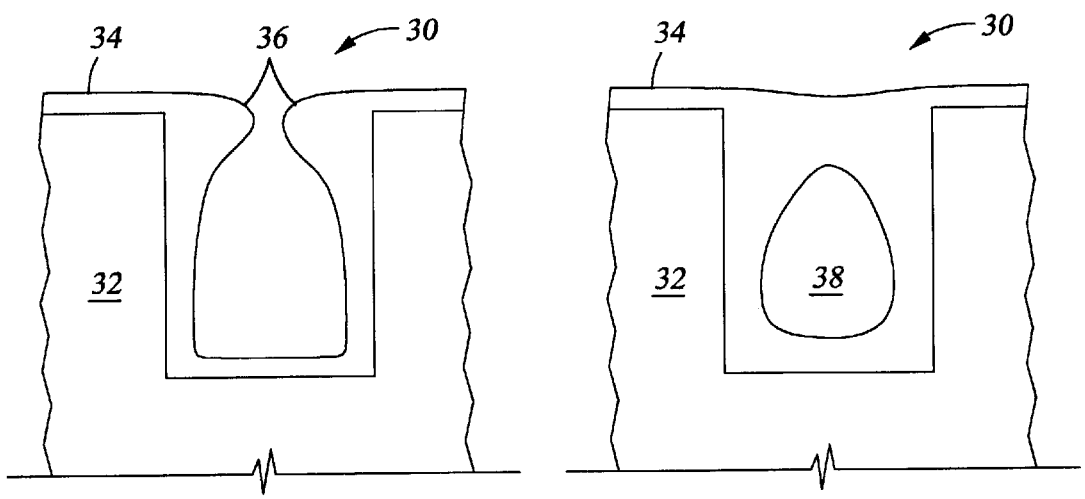
Fig. 3 (PRIOR ART)
Fig. 4 (PRIOR ART)

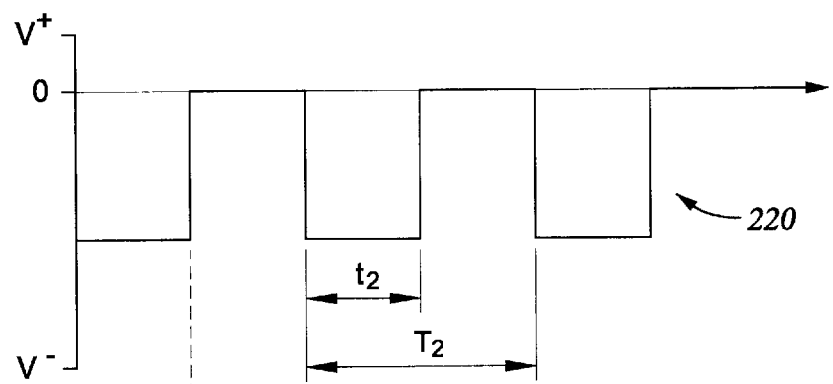
*Fig. 15*
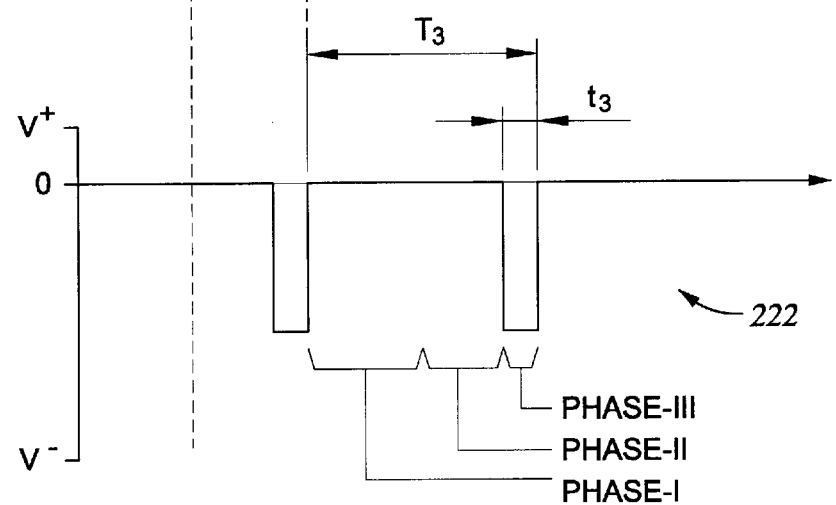
*Fig. 16*
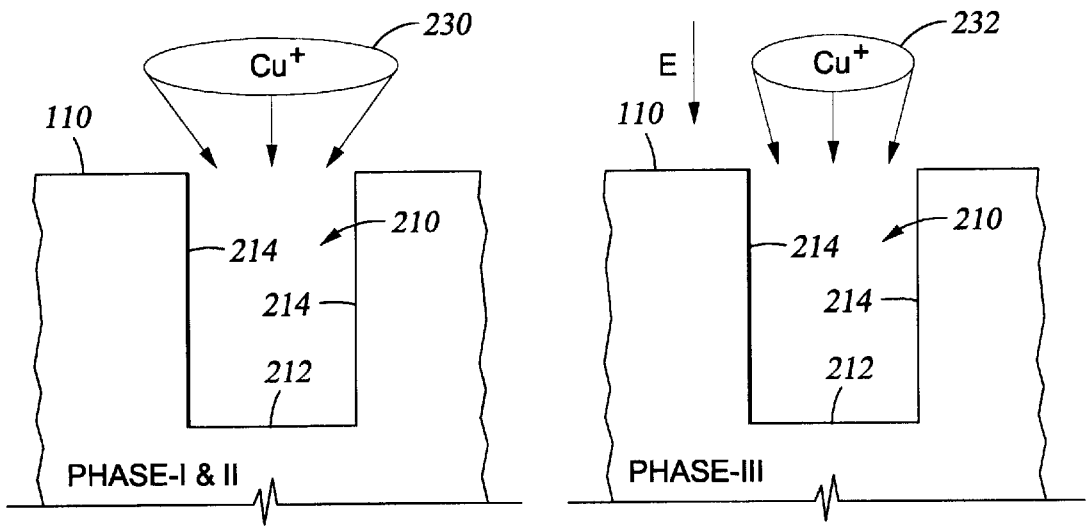
*Fig. 17*     *Fig. 18*

PULSED-MODE RF BIAS FOR SIDE-WALL COVERAGE IMPROVEMENT

This a continuation of co-pending application(s) Ser. No. 09/454,355 filed on Dec. 3, 1999 now U.S. Pat. No. 6,344,419.

BACKGROUND OF THE INVENTION

1. Field of the Invention

The present invention relates to an apparatus and method for processing substrates. Specifically, the invention relates to a method for depositing a conformal layer of material on a substrate in an ionized metal plasma process.

2. Background of the Related Art

Sub-quarter micron multi-level metallization represents one of the key technologies for the next generation of ultra large-scale integration (ULSI) for integrated circuits (IC). In the fabrication of semiconductor and other electronic devices, directionality of particles being deposited on a substrate is important to improve adequate in filling of electric features. As circuit densities increase, the widths of vias, contacts and other features, as well as the dielectric materials between them, decrease to 0.25 $\mu$m or less, whereas the thickness of the dielectric layer remains substantially constant. Thus, the aspect ratios for the features, i.e., the ratio of the depth to the minimum lateral dimension, increases, thereby pushing the aspect ratios of the contacts and vias to 5:1 and above. As the dimensions of the features decrease, it becomes even more important to directionally orient the flux of deposition material reaching the substrate in order to achieve conformal coverage of the feature sidewalls and bottoms.

Conventionally, physical vapor deposition (PVD) systems have been used to deposit materials in device features formed on a substrate. PVD systems are well known in the field of semiconductor processing for forming metal films. Generally, a power supply connected to a processing chamber creates an electrical potential between a target and a substrate support member within the chamber and generates a plasma of a processing gas in the region between the target and substrate support member. Ions from the plasma bombard the negatively biased target and sputter material from the target which then deposits onto a substrate positioned on the substrate support member. However, while such processes have achieved good results for lower aspect ratios, conformal coverage becomes difficult to achieve with increasing aspect ratios. In particular, it has been shown that coverage (i.e., deposited film thickness) of the bottoms of the vias decreases with increasing aspect ratios.

One process capable of providing greater directionality to particles is ionized metal plasma-physical vapor deposition (IMP-PVD), also known as high density physical vapor deposition (HDP-PVD). Initially, a plasma is generated by introducing a gas, such as helium or argon, into the chamber and then coupling energy into the chamber via a biased target to ionize the gas. A coil positioned proximate the processing region of the chamber produces an electromagnetic field which induces currents in the plasma resulting in an inductively-coupled medium/high density plasma between a target and a susceptor on which a substrate is placed for processing. The ions and electrons in the plasma are accelerated toward the target by a bias applied to the target causing the sputtering of material from the target by momentum transfer. A portion of the sputtered metal flux is then ionized by the plasma to produce metal ions in the case where the target comprises a metal. An electric field due to an applied or self-bias develops in the boundary layer, or sheath, between the plasma and the substrate that accelerates the metal ions towards the substrate in a vector parallel to the electric field and perpendicular to the substrate surface. The bias energy is preferably controlled by the application of power, such as RF or DC power, to the susceptor to attract the sputtered target ions in a highly directionalized manner to the surface of the substrate to fill the features formed on the substrate.

One of the problems with HDP-PVD processes is the inability to achieve conformal step coverage in the increasingly smaller device features. Conformal coverage of the bottom and sidewalls of the features is needed to optimize subsequent processes such as electroplating. Electroplating requires conformal barrier and seed layers within the device features in order to ensure uniform filling of the feature. While conventional HDP-PVD achieves good bottom coverage due to the directionality of the ions provided by the bias on the substrate, the sidewall coverage can be less than conformal. This result is caused in part by the induced high directionality of ions towards the bottom of the features with little directionality toward the sidewalls.

The effects of a bias on a substrate can be described with reference to FIGS. 1–2 which illustrate the direction of metal ions 14 entering a via 16 formed on a substrate 10. FIG. 1 illustrates a traditional, i.e., non-HDP, PVD processing environment wherein no bias is supplied to the substrate 10 by an external power generator. In this configuration, the directionality of the ions 14 is determined primarily by the ejection profile of material (usually atoms) from the target and by the inelastic collisions with other particles in the chamber, such as Ar ions which are provided in a plasma. The angular distribution 22 of the ions 14 in FIG. 1 typically results in little deposition on the bottom 18 of the via 16 and an increasingly thinner sidewall thickness as the feature bottom 18 is approached due to a large proportion of the ions 14 striking the substrate 10 at oblique angles.

FIG. 2 illustrates the processing environment in a HDP-PVD process wherein the angular distribution of the ions 14 is influenced by the electrical field E due to an applied or a self-bias at the surface of the substrate. The electric field E is oriented perpendicular to the substrate 10 and the positively charged ions 14 travel along a trajectory parallel to the electric field E toward the bottom 18 of the via 16. The angular distribution 24 of the ions 14 in FIG. 2 typically results in moderate to low deposition on the sidewalls 20 and high to moderate deposition on the bottom 18 than is possible without the bias. As compared to the angular distribution 22 of FIG. 1, the distribution 24 exhibits a tighter pattern indicating more directionality parallel to the electric field E.

Where the electric field E due to the applied bias on the substrate 10 is sufficiently strong, faceting and/or substantial resputtering can occur. Faceting refers to a phenomenon whereby the corners of features is partially etched by charged particles which may include ions from the plasma gas. Faceting can be undesirable because deformations of the device geometry can negatively affect subsequent processes such as electroplating. Additionally, faceting can lead to restricted feature openings and eventually to the formation of voids. Resputtering refers to the removal of deposited material from the substrate by the action of the impinging ions. Resputtering can be undesirable because of the potential for overhangs, i.e., relatively thicker portions of material near the opening of the features. Under the influence of the bias, the charged particles can gain enough kinetic energy to re-sputter a portion of the deposited material. In particular, the material is re-sputtered from the edges of the device features, such as vias, and from the fields of the substrate, which are the upper planar areas of the substrate formed between the features. The re-sputtered material then re-deposits on other areas of the substrate. While some degree of resputtering can be desirable, a problem arises when the re-sputtered material is non-uniformly re-deposited on other portions of the device features resulting in non-uniform device geometries.

The results of the resputtering are illustrated by FIGS. 3 and 4. FIG. 3 is a cross section of a via 30 formed in a substrate 32 having a layer 34 formed thereon, which may be a barrier layer or a seed layer for example. Conventional PVD and HDP-PVD processes produce overhangs 36 which restrict the via 30. The overhangs 36 are shown as portions of the deposited layer 34 at the upper end of the via 30 which are relatively thicker compared to the other portions of the layer 34 due to greater deposition at those locations on the via 30. During continued deposition, the overhangs 36 bridge the entry to the via 30 and a void 38 is formed, as shown in FIG. 4, which leads to defective devices. Void formation is also a problem resulting from faceting because the etched material can redeposit to restrict the feature opening.

Therefore, there is a need to provide a technique for depositing a layer conformally over the surface of features, particularly sub-half micron and higher aspect ratio features.

SUMMARY OF THE INVENTION

The present invention generally provides an apparatus and method for depositing a conformal layer on device features in a plasma chamber using sputtered ionized material. In one embodiment, a chamber having a target, a substrate support member and a magnetic field generator to ionize the target material is provided. The target comprises the material to be sputtered by a plasma formed adjacent to the target during processing. The magnetic field generator may be one or more single-turn or multi-turn coils adapted to ionize the sputtered material. The invention provides methods and apparatus adapted to affect the angular distribution of ions present in the chamber.

In one aspect of the invention, a modulated signal is provided to the support member during processing. Preferably, the modulated signal includes a negative voltage portion and a zero voltage portion. In one embodiment, the waveform of the signal may be modulated.

In another aspect of the invention, modulated signals are provided to the target and the support member. Preferably, the modulated signal supplied to the support member includes a negative voltage portion and a zero voltage portion. In one embodiment, the modulated signal to the target is pulsed between a negative voltage portion and a zero voltage portion. In one embodiment, the waveform of the signals may be modulated.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 1 is a cross section of a substrate having a via formed therein and illustrates a cosine distribution.

FIG. 2 is a cross section of a substrate having a via formed therein and illustrates an over-cosine distribution.

FIG. 3 is a cross section of a substrate illustrating the formation of overhangs.

FIG. 4 is a cross section of a substrate illustrating the formation of a void.

FIG. 15 is a graphical illustration of a pulsed signal to a target.

FIG. 16 is a graphical illustration of a pulsed induced voltage waveform on a substrate.

FIG. 17 is a cross section of a substrate having a via formed therein and illustrates a cosine distribution as a result of modulating a signal to the substrate.

FIG. 18 is a cross section of a substrate having a via formed therein and illustrates an over-cosine distribution as a result of modulating a signal to the substrate.

DETAILED DESCRIPTION OF THE PREFERRED EMBODIMENT

The embodiments described below preferably use a modified ionized metal plasma (IMP) process that can be carried out using process equipment, such as an Endura® platform, available from Applied Materials, Inc., located in Santa Clara, Calif. with modifications as described below. The equipment preferably includes an integrated platform having a preclean chamber, an IMP-PVD barrier layer chamber, a PVD chamber, an IMP-PVD seed layer chamber, and a CVD chamber. One ion metal plasma (IMP) processing chamber, known as an IMP VECTRA™ chamber is available from Applied Materials, Inc., of Santa Clara, Calif.

Figure 5:
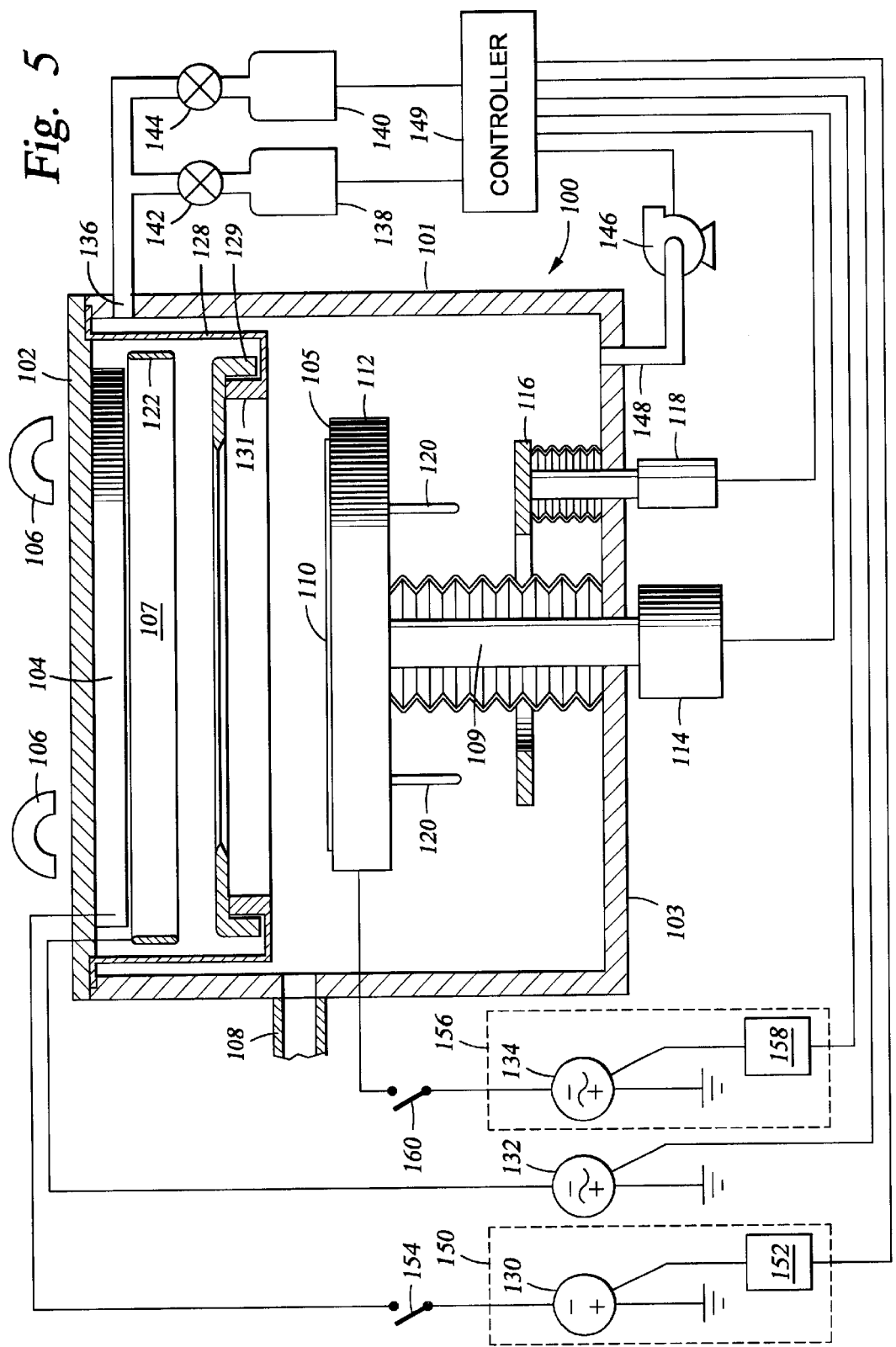
FIG. 5 is a cross section of a simplified processing chamber of the invention using a coil.

FIG. 5 is a schematic cross-sectional view of an IMP chamber 100 according to the present invention. The chamber 100 includes walls 101, lid 102, and bottom 103. A target 104 comprising the material to be sputtered is mounted to the lid 102 and disposed in the chamber 100 to define an upper boundary to a processing region 107. Magnets 106 are disposed behind the lid 102 and are part of a rotatable magnetron which trap electrons during operation and increase the density of a plasma adjacent to the target 104.

A substrate support member 112 is movably disposed in the chamber 100 and in a raised processing position defines the lower boundary to the processing region 107. The substrate support member 112 provides an upper support surface 105 for supporting a substrate 110. Lift fingers 120 are vertically movably disposed in the substrate support 112 to assist in positioning the substrate onto the upper surface 105. Actuation of the lift fingers 120 is enabled by an elevator plate 116 and actuator 118. The support member 112 is mounted on a stem 109 connected to a motor assembly 114 that raises and lowers the substrate support 112 between a lowered loading/unloading position and the raised processing position. An opening 108 in the chamber 100 provides access for a robot (not shown) to deliver and retrieve substrates 110 to and from the chamber 100 while the substrate support member 112 is in the lowered loading/unloading position.

A coil 122 is mounted in the chamber 100 between the substrate support member 112 and the target 104 and provides magnetic fields in the chamber 100 during processing to assist in generating and maintaining a plasma between the target 104 and substrate 110. The magnetic fields produced by the coil 122 induce currents in the plasma to produce a denser plasma which, in turn, ionizes the material sputtered from the target 104. At least a portion of the ionized material is then deposited on the substrate 110.

The chamber 100 includes a process kit comprising a process shield 128 and a shadow ring 129. The process shield 128 is annular member suspended from the lid 102 between the coil 122 and the body 101. An upwardly turned wall 131 of the process shield 128 is adapted to support the shadow ring 129 while the support member 112 is in a lowered position. To provide a return path for RF currents in the chamber 100 the process shield is preferably coupled to ground.

One or more plasma gases are supplied to the chamber 100 through a gas inlet 136 from gas sources 138, 140 as metered by respective mass flow controllers 142, 144. A vacuum system 146 is connected to the chamber 100 at an exhaust port 148 to exhaust the chamber 100 and maintain the desired pressure in the chamber 100. Preferably, the vacuum system 146 includes a cryopump and a roughing pump and is capable of sustaining a base pressure of about $10^{-8}$ mTorr.

Multiple signal generators/power supplies are used in the chamber 100. A first signal generator 150 coupled to the target 104 provides a signal thereto. Preferably, the first signal generator 150 includes a power supply 130 and a waveform modulator 152. While the power supply 130 is preferably a DC power supply, in another embodiment an RF power supply may be used. Optionally, current from the power supply 130 to the target 104 is controlled by a switch 154. A second signal generator 156 provides a modulated signal, preferably RF or DC, to the substrate support member 112 to bias the substrate 110 disposed thereon during processing. The second signal generator 156 preferably includes a power supply 134, shown here as an RF power source, and a waveform modulator 158. Optionally, current from the power supply 134 to the target 104 is controlled by a switch 160. Both waveform modulators 152 and 158 include circuitry adapted for the modulation of the waveform, frequency and amplitude of output signals. A third power supply 132 supplies electrical power in the megahertz range to the coil 122 to increase the density of the plasma.

Figure 6:
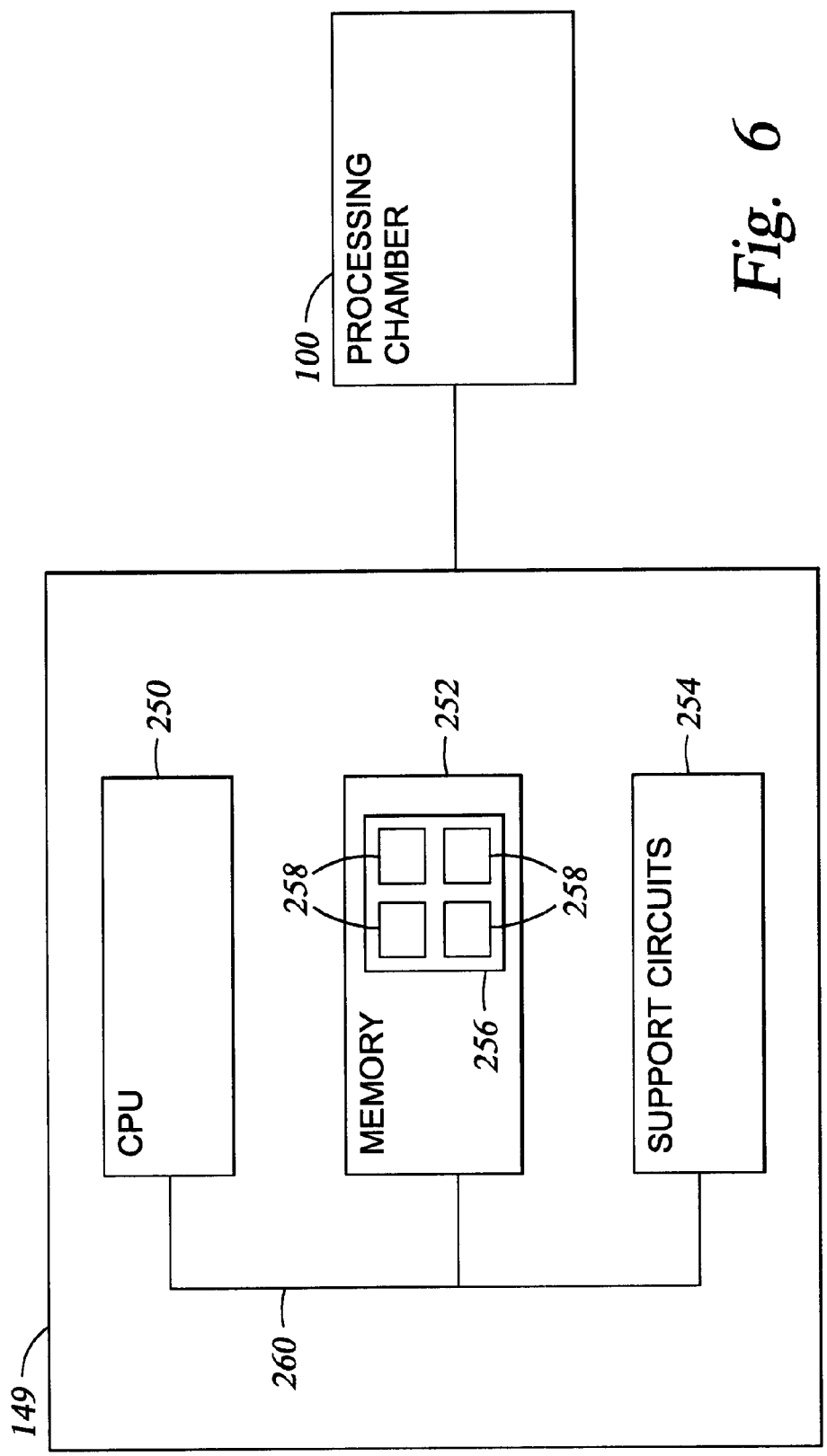
FIG. 6 is a schematic illustration of a controller used to control the processing system shown in FIG. 5.

The operation of the chamber 100 and the various related components are preferably controlled by a controller 149. In particular, the controller 149 generates signals that control the operation of both signal generators 150, 156 as required to perform the processes of the invention described below. A schematic representation of the controller is shown in FIG. 6. The controller 149 comprises a bus line 260 coupling a central processing unit (CPU) 250, a memory 252, and support circuits 254 for the CPU 250. The CPU 250 may be any general purpose computer processor that can be used in an industrial setting for controlling various chambers and subprocessors. The support circuits 254 are coupled to the CPU 250 for supporting the processor in a conventional manner. These circuits include cache, power supplies, clock circuits, input/output circuitry and subsystems, and the like. The memory 252, or computer-readable medium, is coupled to the CPU 250 and may be one or more of readily available memory such as random access memory (RAM), read only memory (ROM), floppy disk drive, hard disk, or any other form of digital storage, local or remote. A deposition process is generally stored in the memory 252, typically as a software routine 256, or program product. The software routine 256 may also be stored and/or executed by a second CPU (not shown) that is remotely located from the hardware being controlled by the CPU 250. The software routine 256 includes multiple subroutines 258 each of which are adapted to perform the various operations described below.

In operation, a robot delivers a substrate 110 to the chamber 100 through the opening 108. Positioning of the substrate 110 onto the upper surface 105 is accomplished by raising the lift fingers 120, using the actuator 118 and elevator plate 116, to contact the lower surface of the substrate 110. The substrate support 112 is then raised while holding the lift fingers 120 in place, thereby causing the substrate 110 to be lowered onto the upper surface 105. After depositing the substrate 110 unto the upper surface 105 of the support member 112 the robot retracts from the chamber 100 and the opening 108 is sealed. The substrate support member 112 then raises the substrate 110 into a processing position. During the upward movement of the support member 112 the shadow ring 129 is lifted from the process shield 128. During processing, the shadow ring 129 covers a perimeter portion (a few millimeters) of the substrate 110. Preferably, the distance between the target 104 and the substrate support member 112 in a raised processing position is about 90–160 mm for a 200 mm chamber operating between about 10 mTorr and 70 mTorr. One or more plasma gases are then introduced into the chamber 100 from the gas sources 138, 140 to stabilize the chamber 100 at a processing pressure. The magnets 106, which comprises components of a magnetron, then facilitate the formation of a plasma adjacent the target 104 and the first signal generator 150 provides a bias which attracts the charged particles of the plasma toward the target 104 to cause sputtering therefrom. The coil 122 is energized by the third signal generator 132 and operates to increase the density of the plasma, thereby facilitating ionization of sputtered target material. A portion of the ions formed from the sputtered target material continue to traverse the processing region 107 between the target 104 and the support member 112 and deposit on the substrate 110. Deposition onto the substrate 110 is enhanced by a bias on the substrate 110 provided by the signal generator 156. The biases to the target 104 and support member 112 are controlled according to the processes described in detail below.

Following the deposition cycle, the substrate support member 112 is lowered to a loading/unloading position. The robot is then extended into the chamber 100 through the opening 108 and the substrate 110 is placed on the robot for removal from the chamber 100 and delivery to a subsequent location. Subsequent locations include various processing chambers, such as electroplating chambers, where the substrate 110 undergoes additional processing.

The directionality of the material sputtered from the target 104 during processing is determined, in part, by the voltage drop between the plasma and the substrate 110 due to the applied or self-bias on the substrate 110. The voltage drop occurs in a region known as the sheath and effects an electrical field perpendicular to the substrate 110 which provides directionality of the ionized target material toward the substrate 110, thereby enhancing bottom coverage (while relatively reducing sidewall coverage) of the device feature. In order to achieve improved sidewall coverage, the invention modulates one or both of the bias on the substrate 110 and the bias on the target 104. Good step coverage on the device features of the substrate 110 is achieved by ensuring the proper proportions of bottom coverage and sidewall coverage.

In one aspect of the invention, the bias signal provided to the support member 112 is modulated in various manners to achieve greater control over the deposition of a film on the substrate 110. In general, the signal attributes to be controlled by the invention are waveform, frequency and amplitude. While the following embodiments are described with reference to the particular devices described above with reference to FIG. 5, persons skilled in the art will recognize alternative apparatus and techniques of practicing the invention.

In a first embodiment of the invention, a deposition process is accomplished in two phases wherein the bias to the support member 112 is pulsed between a negative voltage (phase I) and zero (0) voltage (phase II) while the voltage to target 104 is held constant. This may be done using the controller 149 and executing the appropriate subroutine 258 stored in memory 252 (shown in FIG. 6). According to the particular file executed, the controller 149 transmits a corresponding signal to the waveform generator 158 which outputs the desired waveform to the power supply 134. The output of the signal generator 156 is then applied to the support member 112. Application of the signal from the signal generator 156 induces a voltage (Vdc) on the support member 112. Where the substrate 110 comprises a conductive material, or layer of material, the bias may be applied directly to the substrate 110. In cases where the substrate 110 comprises a non-conductive material, the bias voltage is capacitively coupled to the substrate 110.

Figure 7:
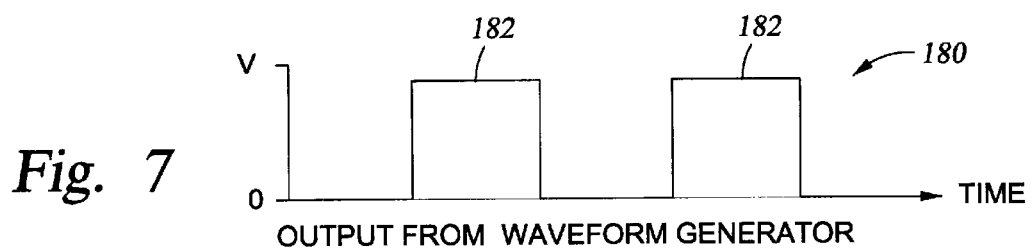
FIG. 7 is a graphical illustration of a pulsed output signal from a waveform generator.
Figure 8:
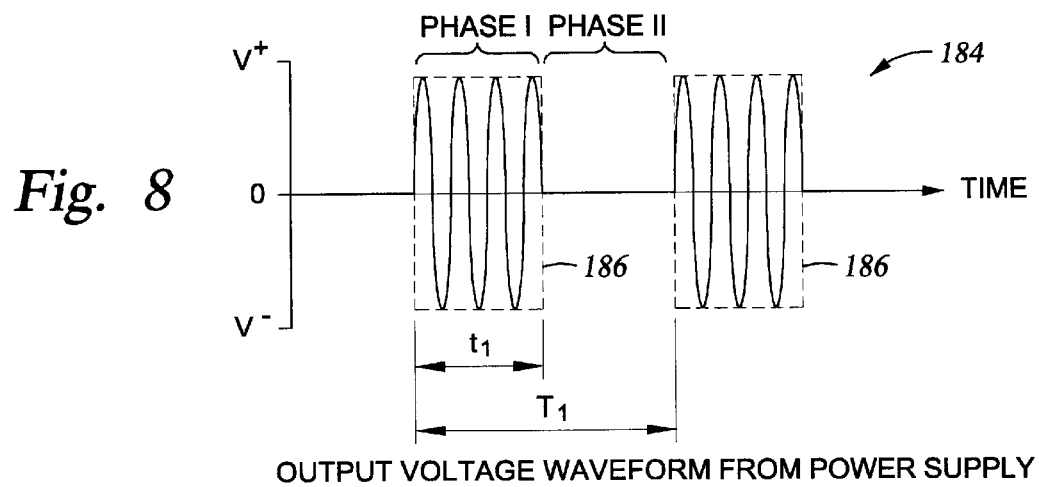
FIG. 8 is a graphical illustration of a pulsed output signal from an RF power supply coupled to the waveform generator.
Figure 9:
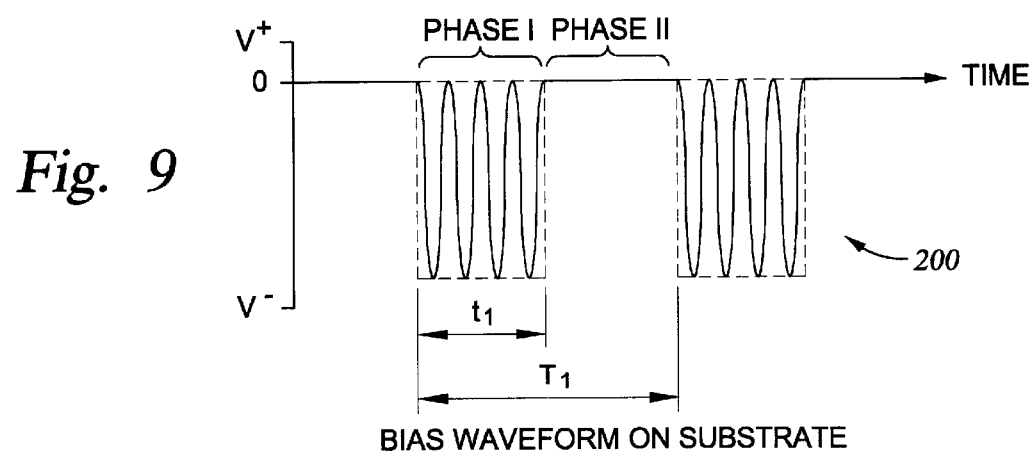
FIG. 9 is a graphical illustration of a pulsed bias waveform on a substrate.

The output of the waveform generator 158, the signal generator 156 and the bias waveform on the substrate 110 disposed on the support member 112 are shown in FIGS. 7, 8 and 9 respectively. FIG. 7 shows the waveform 180 supplied from the waveform generator 158 to the power supply 134. The waveform 180 carries the information regarding the desired shape, voltage and frequency of the signal to be applied to the support member 110. The waveform 180 is a pulsed square wave comprising periodic power pulses 182. Thus, the waveform 180 includes a first phase wherein a pulse 182 is supplied to power supply 134 and a second phase wherein no signal is provided. At the power supply 134, the waveform 180 is converted into a corresponding output signal 184 of the desired shape, voltage, and frequency which is then supplied to the substrate support member 112. As shown in FIG. 8, the resulting output signal 184 from the power supply 134 has a first portion (phase I) which varies inside an envelope 186 between a negative and positive voltage and a second portion (phase II) at zero volts. Preferably, the signal during the second portion is a RF signal having a frequency of 13.56 MHz, however, other frequencies may be used. Thus, the signal generator 156 produces a pulsed output, thereby only periodically providing a bias to the support member 112. The output signal 184 has a pulse width $t_1$ (defining phase I) and a period $T_1$.

The resulting bias waveform 200 on the substrate 110 is shown in FIG. 9 and illustrates that the output signal 184 from the signal generator 156 experiences a negative voltage shift. This shift occurs in the presence of the plasma because the output signal 184 during phase II is a RF signal which varies with time. While electrons of a plasma can be alternately attracted and repulsed relative to the substrate 110 according to the RF output waveform 184 from the signal generator 156, the plasma ions are unable to respond to rapidly changing polarity of the RF signal because of their substantially larger inertia. The difference between ions and electrons of the plasma in their ability to respond to the changing polarity of the RF signal results in the shift.

Figure 10:
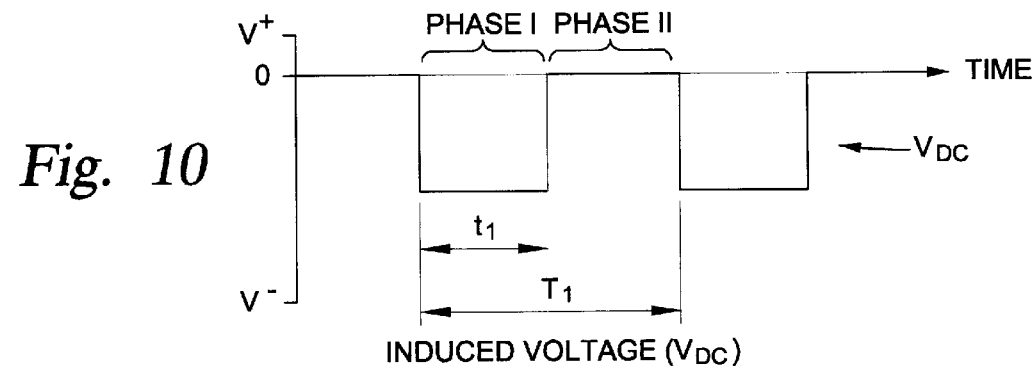
FIG. 10 is a graphical illustration of a pulsed induced voltage waveform on the substrate.

The quantity of the shift of the output signal 184 from the signal generator 156 is generally known as a self-bias voltage, Vdc. FIG. 10 shows the quantity of the shift of the output signal 184 on the substrate 110. The resulting self-bias Vdc on the support member 112 illustrates phase I wherein a voltage is applied and phase II wherein no voltage is applied. The period and pulse width of Vdc is determined by the output of the signal generator 156. Thus, Vdc is a step function or square wave having the pulse width $t_1$ and the period $T_1$.

Figure 11:
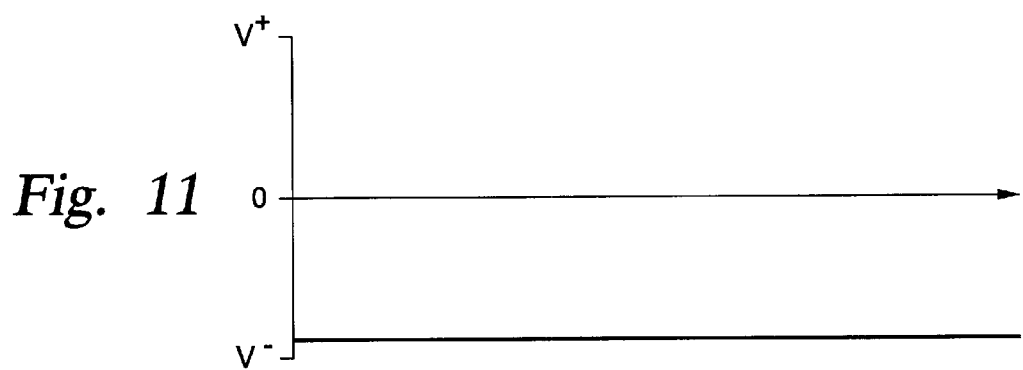
FIG. 11 is a graphical illustration of a constant voltage signal to a target.

The waveform of the bias on the target 104, as determined by the first signal generator 150, is shown in FIG. 11 which indicates that the target bias is held at a constant voltage throughout the process, i.e., during phase I and II. Thus, sputtering from the target 104 is constantly maintained at a substantially constant rate.

By controlling the duty cycle of the bias waveform 200 applied to the substrate 110, the desired proportions of bottom and sidewall coverage of the features formed in the substrate 110 are possible. The duty cycle, $t_1/T_1$, is preferably between about 30–70% with a bias pulse width $t_1$ between about 1 μs to 10 seconds and a frequency ($1/T_1$) between about 0.1 Hz–1 MHz. More generally, a lower duty cycle ($t_1/T_1$) results in more sidewall coverage while a higher duty cycle ($t_1/T_1$) results in more bottom coverage, as will be described further below. It is noted that the frequency (typically 13.56 MHz) of the RF carrier signal is distinct from the frequency ($1/T_1$) at which the signal is pulsed or modulated.

Figures 12, 13:
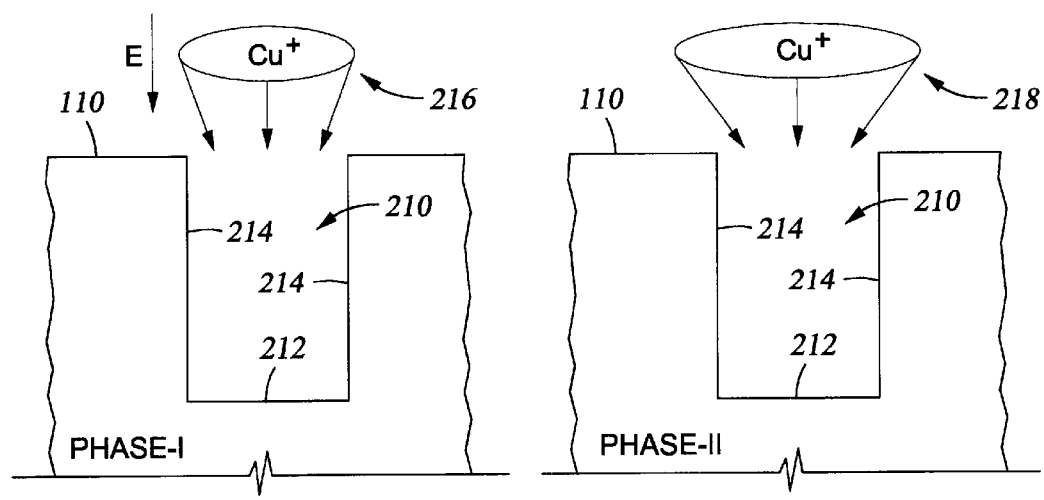
FIG. 12 is a cross section of a substrate having a via formed therein and illustrates an over-cosine distribution as a result of modulating a signal to the substrate.
FIG. 13 is a cross section of a substrate having a via formed therein and illustrates a cosine distribution as a result of modulating a signal to the substrate.
Figures 14A, 14B, 14C, 14D:
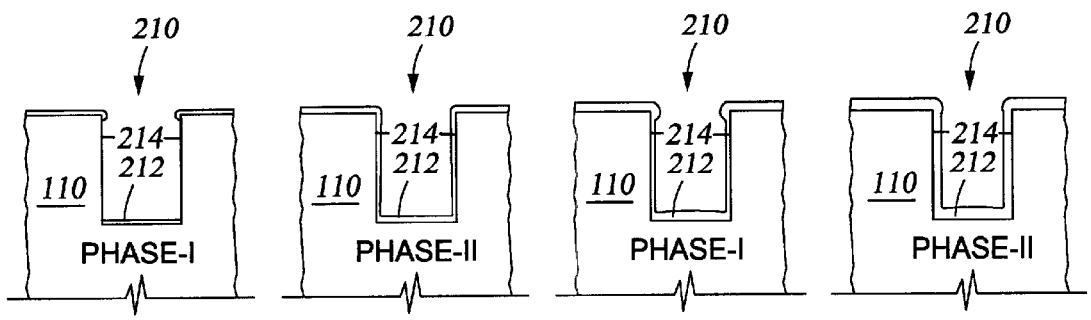
FIGS. 14A–D are a series of cross sectional views of a substrate having a via formed therein and illustrates the effects of signal modulation on deposition in the via.

In phase I, the power supplied to the support member 112 induces the negative bias Vdc on the substrate 110 as illustrated graphically in FIG. 9. The negative bias attracts positively charged particles, primarily the ionized metal, toward the substrate 110. Because the bias Vdc establishes a resulting electric field E substantially perpendicular to the substrate 110, the positively charged particles in the processing region 107 assume a trajectory substantially perpendicular to the substrate 110. FIG. 12 is a cross section of a feature 210, such as a via or contact, formed in the substrate 110, wherein the feature 210 comprises a bottom 212 and sidewalls 214. The angular distribution pattern 216 of incoming ions, shown here as Cu ions, exhibits substantial perpendicularity relative to the substrate 110 due to the negative bias Vdc on the substrate 110. As a result, application of the bias achieves more deposition on the bottom 212 than is possible without the bias on the substrate 110.

In phase II, the current from the signal generator 156 is terminated. Without the presence of an applied bias to the substrate 110, the charged particles in the chamber 100 exhibit less directionality perpendicular to the substrate 110. A representation of the resulting distribution pattern 218 is shown in FIG. 13 and indicates that the particles experience less directionality with respect to the substrate 110 and tend to strike the substrate 110 at oblique angles in greater proportions. As a result, the absence of the applied bias to the substrate 110 allows a higher percentage of ions to deposit on the sidewalls 214 than is possible with the applied bias.

As noted above, a lower duty cycle results in more sidewall coverage while a higher duty cycle results in more bottom coverage. This result follows because a lower duty cycle (i.e., short $t_1$) corresponds to a relatively higher percentage of phase II in the duty cycle wherein the resulting angular distribution produces more sidewall coverage. A higher duty cycle (i.e., high $t_1$), on the other hand, corresponds to a relatively longer phase I wherein the resulting angular distribution produces more bottom coverage.

The effect of pulsing the bias on the substrate 110 is illustrated in FIGS. 14A–D which shows the progressive deposition of a material on the substrate 110. During phase I (FIGS. 14A and 14C) the percentage of deposition on the bottom 212 of the feature 210 is higher, while during phase II (FIGS. 14B and 14D) the percentage of deposition on the sidewalls 214 is higher. By modulating the substrate bias to vary the angular distribution of ions, the profile of the deposition may be controlled, thereby resulting in conformal step coverage and void-free deposition.

In an alternative embodiment, the modulated bias on the substrate 110 can also be achieved by periodically opening and closing the switch 160 at a desired frequency while a constant current and voltage is provided by the second signal generator 156. With the switch 160 in a closed position, power is supplied to the support member 112 to induce a negative induced bias Vdc thereon as indicated by phase I in FIG. 9, thereby establishing an electric field in the sheath between the plasma and the substrate 110. When the switch 160 is subsequently opened in phase II, the Vdc is terminated, thereby substantially reducing the electric field in the sheath. Accordingly, the angular distribution pattern of ions can be modulated depending on the presence of the electric field E, as shown in FIGS. 12–13. The modulated angular distribution pattern, in turn, accommodates the desired proportions of sidewall coverage and bottom coverage of a device feature. During phase I, when the switch 160 is closed, the angular distribution of the ions is an over-cosine distribution, resulting in more deposition on the bottom 212 of the feature 210. During phase II, when the switch 160 is open, the angular distribution of the ions is a cosine distribution, resulting in more deposition on the sidewalls 214 of the feature 210. Such an arrangement using switch 160 avoids the need for a more elaborate and expensive arrangement using the waveform modulator 158.

In another embodiment, a three phase approach is used to deposit material on a substrate whereby the signal to the target 104 and the support member 112 is modulated. The phases include a first target biasing phase (phase I), a neutral phase (phase II) and a support member biasing phase (phase III). The signals to the target 104 and the support member 112 are shown in FIGS. 15 and 16, respectively.

During phase I, power is supplied from the first signal generator 150 to the target 104 while the support member 112 is electrically neutral, i.e., no power is supplied from the second signal generator 156. The resulting negative bias on the target 104 attracts positively charged ions adjacent the target 104 such as Ar ions which are made available from the Ar gas supplied by the plasma gas sources 142, 144. The Ar ions strike the target 104 and cause sputtering of material (typically atoms) therefrom. As shown in FIG. 15, the power supplied to the target 104 is a pulsed signal 220 and preferably has a duty cycle of between about 10% and 50% and a pulse width $t_2$ of between about 0.1 $\mu$s and 10 $\mu$s and a period $T_2$ between about 1 $\mu$s and 100 $\mu$s. Thus, the pulse frequency ($1/T_2$) is between about 10 KHz–1 MHz.

During phase II, both the target 104 and the support member 112 are electrically neutral, i.e., no power is supplied from either of the signal generators 150, 156. During this period of time, the material sputtered from the target 104 during phase I traverses the processing region 107 between the target 104 and the substrate 112 and is ionized by the plasma in the chamber 100. A portion of the ionized material then deposits on the substrate 110 to form a film thereon. In one embodiment, phase II may have a time duration between about 0.1 $\mu$s and 1 $\mu$s.

During phase III, the target 104 remains unbiased and a signal is provided to the support member 112 from the second signal generator 156. As shown in FIG. 16, the power supplied to the support member 112 is a pulsed signal 222 and preferably has a duty cycle of between about 10–50% and a pulse width $t_3$ of about 0.1 $\mu$s and 10 $\mu$s and a period $T_3$ of 1–100 $\mu$s seconds. Thus, the pulse frequency ($1/T_3$) is between about 10 KHz–1 MHz.

FIGS. 17 and 18 illustrate the effects of modulating the target bias and the substrate bias on the material being deposited at the substrate surface. FIGS. 17–18 are cross sections of a feature 210 formed on the substrate 110 having a bottom 212 and sidewalls 214. During phases I and II, the target 104 is sputtered while no bias is applied to the substrate 110. In the absence of an applied bias to the substrate 110, the distribution pattern of the ionized flux is relatively broader, such as the pattern shown in FIG. 17. As a result, a higher percentage of the ions strike the substrate 110 at an oblique angle than would occur with an applied substrate bias. The resulting distribution pattern 230 of the ionized target flux (shown here as Cu) provides relatively more deposition on the sidewalls 214 than on the bottom 212 as compared to phase III. During phase III, the signal supplied by the second signal generator 156 induces a negative bias on substrate 110 providing an attractive force to the ionized target flux and causing highly anisotropic deposition of the ionized material relative to the substrate 110. Application of the bias results in good coverage of the bottom 212 of the device feature 210 formed on the substrate 110. The resulting distribution pattern 232 of the ionized target flux generated during the application of a negative bias to the substrate is shown in FIG. 18.

Figures 19A, 19B, 19C, 19D:
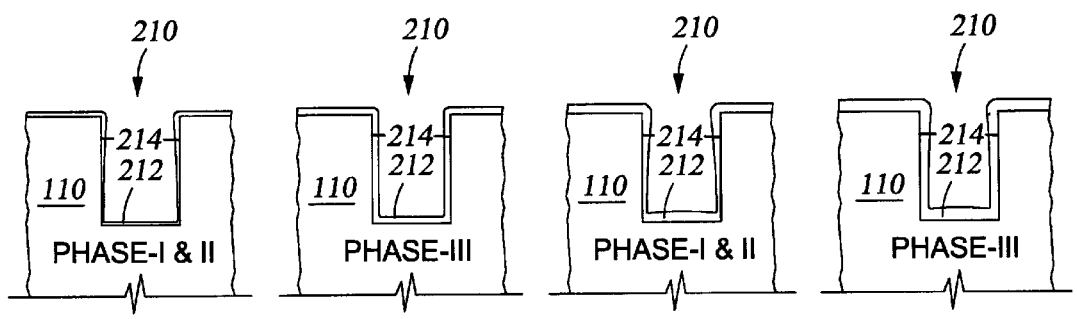
FIGS. 19A–D are a series of cross sectional views of a substrate having a via formed therein and illustrates the effects of signal modulation on deposition in the via.

The effect of the three phase pulsing method described above on deposition is illustrated in FIGS. 19A–D which show the progressive deposition of material on the substrate 110. Phase I provides a "burst" of material sputtered from the target 104. During phase I no material is being deposited on the substrate 110 because, although the target 104 has been sputtered, no material has yet traversed the space between the target 104 and the substrate 110 to reach the substrate 110. In phase II, the burst of material is ionized and arrives at the unbiased substrate to provide relatively more deposition on the sidewalls 214 of the features 210 (FIGS. 19A and 19C). During Phase III, the ionized material continues to arrive at the substrate which is now biased to ensure relatively more deposition on the bottoms 212 of the features 210 (FIGS. 19B and 19D). By modulating the bias on the substrate (Vdc) to vary the angular distribution of ions, the profile of the deposition may be controlled, thereby resulting in conformal step coverage and void-free deposition.

This latter approach provides additional control during an ionized metal plasma deposition process and has particular utility where re-sputtering is a problem due to the bias on the substrate. As described with respect to each of the embodiments above, periodic application of a negative bias to the support member 112 attracts charged particles, thereby increasing the incidence rate and momentum of the particles on the substrate 110. While the bias allows for greater control of the directionality of the particles relative to the substrate, a sufficiently high bias can cause faceting of the features or resputtering of the material already formed on the substrate 110 and lead to undesirable device shapes. As described above, faceting and re-sputtering can be undesirable because of the potential for detrimental effects on subsequent processes and void formation.

Because a bias to the substrate 110 is applied only for a short period of time, the process described with reference to FIGS. 15–19 provides a method of controlling faceting/re-sputtering and minimizing undesirable material formations in or on the device features. The "burst" of target material sputtered from the target 104 during phase I is given sufficient time to ionize during phase II before application of the bias to the substrate 110 in phase III. Thus, faceting of the feature and re-sputtering of the film by the Ar ions during phase I and II is avoided (or minimized where the substrate maintains some negative self-bias). By simultaneously modulating the bias to the target 104, the amount of material available for deposition can be controlled to avoid excessive deposition on the sidewalls of device features.

Additionally, terminating the bias to the target for a period of time ensures that a relatively higher electron temperature is maintained in the plasma. The inventors determined that maintaining a constant bias on the target can significantly depress the electron temperature of the plasma over time. As a result, the rate at which target flux is ionized is decreased. By modulating the target bias higher ionization efficiency is achieved.

Figure 20:
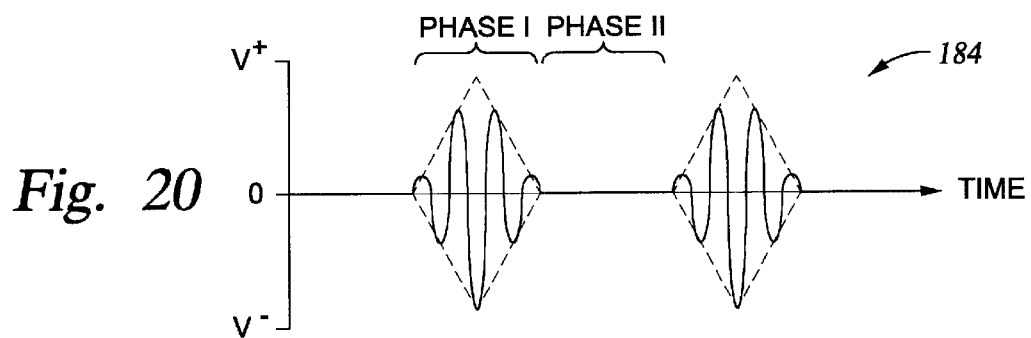
FIGS. 20–22 illustrate varying waveforms output from a signal source to a support member.
Figure 21:
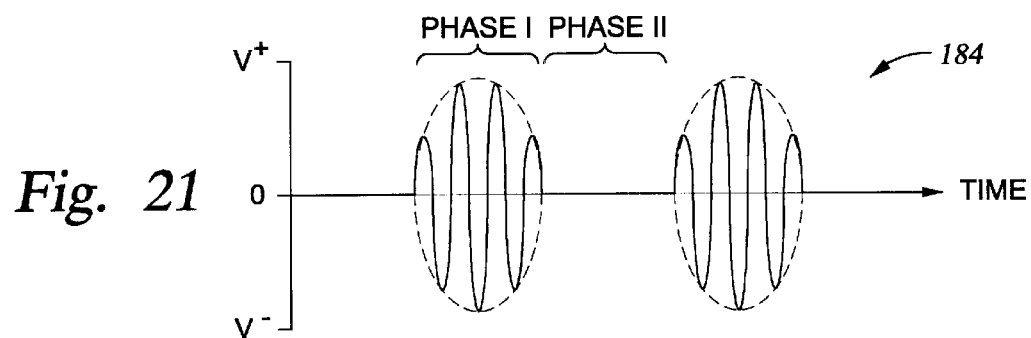
Figure 22:
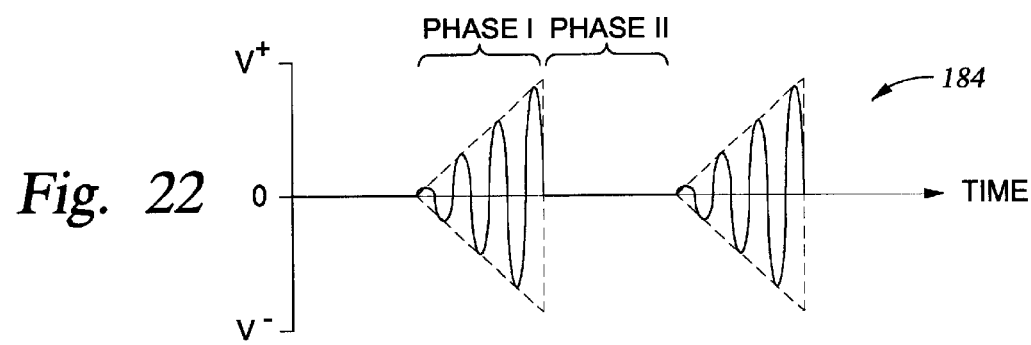

While the foregoing embodiments utilize a step function waveform (i.e., the AC signal is supplied at zero or at full frequency/power), the present invention contemplates varying the waveform and/or amplitude to manipulate the energy and velocity of the ionized target material. Thus, rather than abruptly altering the angular distribution of the ionized material with square wave pulses, such as are shown in FIGS. 7–10 and 16, the bias waveform of the output signal 184 provided to the substrate 110 may allow a more gradual ramping up to a peak voltage and ramping down to zero voltage. FIGS. 20–22 are illustrative of other waveforms which may produced by the signal generator 156 and applied to the substrate to induce a bias thereon. By controlling the waveform of the signal applied to the substrate being processed, the ion directionality and, hence, the deposition profile, can be adjusted to achieve a desired result.

While the foregoing is directed to the preferred embodiment of the present invention, other and further embodiments of the invention may be devised without departing from the basic scope thereof, and the scope thereof is determined by the claims that follow.

What is claimed is:

1. A method for controlling directionality of ionized material traveling from a target toward a substrate in a semiconductor processing system, comprising:
    providing a first partially modulated signal to a substrate positioned on a substrate support member;
    providing a second signal to the target; and
    providing a magnetic field in a plasma region, wherein the first partially modulated signal is modulated between a first voltage and a second voltage during a first time period, and wherein the first partially modulated signal is constant during a second time period.

2. The method of claim 1, wherein a duty cycle of the first signal is between about 30% and about 70%.

3. The method of claim 1, wherein a duty cycle of the second signal is between about 10% and about 50%.

4. The method of claim 1, wherein providing the first partially modulated signal comprises using a waveform modulator to transmit a modulated signal to a power supply in electrical communication with the substrate.

5. The method of claim 4, wherein the power supply comprises at least one of a DC power supply and an RF power supply.

6. The method of claim 1, wherein the second signal comprises a constant voltage DC signal.

7. The method of claim 1, wherein providing a magnetic field in a plasma region comprises energizing a coil positioned proximate the plasma region.

8. The method of claim 7, further comprising supplying an RE signal to the coil.

9. The method of claim 1, further comprising alternating the second signal between a constant negative voltage and a ground voltage.

10. The method of claim 1, wherein providing a first partially modulated signal to a substrate positioned on a substrate support member further comprises providing a third partially modulated signal to the substrate support member, the third partially modulated signal being voltage shifted negatively to result in the first partially modulated signal, wherein the first partially modulated signal has a modulation portion and a zero portion, the modulation portion being between a negative voltage and a slightly positive voltage at the substrate.

11. A method for controlling sidewall coverage in a semiconductor deposition chamber, comprising:
    providing a first electrical signal to a substrate positioned in the deposition chamber, the electrical signal having a modulated portion and a constant portion, the modulated portion varying between a negative voltage and a slightly positive voltage;
    providing a second electrical signal to a target positioned above the substrate in the deposition chamber, the second signal being a constant DC voltage; and
    providing a magnetic field in the deposition chamber.

12. The method of claim 11, wherein a portion of the first electrical signal comprises a modulated signal generated by a power supply, the modulated waveform having generally equal positive and negative portions, the modulated waveform being delivered to the substrate support member and being negatively voltage shifted as a result of interaction with a plasma.

13. The method of claim 12, wherein the negative voltage shift results in the modulated portion of first electrical signal delivered to the substrate.

14. The method of claim 11, wherein the first electrical signal has a duty cycle of between about 30% and about 70%.

15. The method of claim 11, wherein a pulse width of the modulated portion of the first electrical signal is between about 1 µs and about 10 seconds and is at a frequency of between about 0.1 Hz and about 1.0 MHz.

16. The method of claim 11, wherein the second electrical signal has a duty cycle of between about 10% and about 50%.

17. The method of claim 11, wherein the second signal comprises a constant voltage DC signal.

18. The method of claim 11, wherein providing a magnetic field in the deposition chamber comprises providing power to a coil configured to induce an electrical current into a plasma generated in a processing chamber, the power supplied to the coil being in the megahertz range.

19. The method of claim 17, further comprising supplying an RF electrical signal to the coil.

20. The method of claim 11, further comprising alternating the second electrical signal between a constant negative voltage and a zero voltage.

21. The method of claim 11, wherein the first electrical signal and the second electrical signal are generated by at least one of an RF power supply and a DC power supply.

* * * * *